United States Patent
Gupta et al.

(10) Patent No.: US 6,496,961 B2
(45) Date of Patent: Dec. 17, 2002

(54) DYNAMIC DETECTION AND REMOVAL OF INACTIVE CLAUSES IN SAT WITH APPLICATION IN IMAGE COMPUTATION

(75) Inventors: Aarti Gupta, Princeton, NJ (US); Zijiang Yang, Plainsboro, NJ (US); Anubhav Gupta, Pittsburgh, NJ (US); Pranav Ashar, Belle Mead, NJ (US)

(73) Assignee: NEC USA, Inc., Princeton, NJ (US)

( * ) Notice: Subject to any disclaimer, the term of this patent is extended or adjusted under 35 U.S.C. 154(b) by 0 days.

(21) Appl. No.: 09/880,871

(22) Filed: Jun. 15, 2001

(65) Prior Publication Data

US 2002/0053064 A1 May 2, 2002

Related U.S. Application Data

(60) Provisional application No. 60/243,440, filed on Oct. 27, 2000.

(51) Int. Cl.$^7$ .............................................. G06F 17/50
(52) U.S. Cl. ............................................... 716/5; 716/7
(58) Field of Search .......................... 716/5, 6, 7, 18, 716/4; 395/500.05; 364/900, 200

(56) References Cited

U.S. PATENT DOCUMENTS 4,916,657 A * 4/1990 Morton ....................... 364/900
6,247,164 B1 * 6/2001 Ashar et al. .................... 716/5

* cited by examiner

*Primary Examiner*—Don Wong
*Assistant Examiner*—Wilson Lee
(74) *Attorney, Agent, or Firm*—Sughrue Mion, PLLC

(57) ABSTRACT

This disclosure teaches a method of Boolean satisfiability checking (SAT) for a circuit. The method comprises identifying inactive clauses in the conjunctive normal form (CNF) of the circuit and removing the inactive clauses from the CNF.

13 Claims, 6 Drawing Sheets

| prolog circuit | | No ICR | | With ICR | | | |
|---|---|---|---|---|---|---|---|
| Step | Reached States | Time (s) | # BDD Leaves | Time (s) | # BDD Leaves | % Inactive Clauses | % Inactive and Unsat Clauses |
| 1 | 3.77487e+07 | 18.1 | 2 | 17.2 | 2 | 31.8 | 14.5 |
| 2 | 4.93249e+09 | 7.4 | 3 | 7.1 | 3 | 32.9 | 14.3 |
| 3 | 5.95738e+14 | 35.1 | 11 | 55.2 | 12 | 38.8 | 16.0 |
| 4 | 1.29149e+16 | 705.2 | 24 | 595.0 | 22 | 36.9 | 12.4 |
| 5 | 1.7276e+17 | 1872.9 | 24 | 2671.3 | 22 | 36.9 | 12.4 |
| 6 | 5.99378e+17 | 2814.7 | 26 | 645.8 | 22 | 36.9 | 12.4 |
| 7 | 7.22992e+17 | 2108.5 | 26 | 380.2 | 22 | 36.9 | 12.4 |
| 8 | 7.2778e+17 | 3485.1 | 40 | 293.6 | 22 | 36.9 | 12.4 |
| 9 | 7.2778e+17 | 128.1 | 23 | 32.0 | 22 | 36.9 | 12.4 |
| Total | 7.2778e+17 | 11175.0 | 179 | 4697.5 | 149 | 36.8 | 12.8 |
| | | Peak BDDs=8.7M Live BDDs=2.7M | | Peak BDDs=2.7M Live BDDs=0.9M | | | |

FIG. 2

```
generate_cnf_circuit()
{
   foreach output node n {
     generate_cnf_node(n);
   }
} generate_cnf_node(n)
{
   // termination condition
   if (n is a primary input)
     return;
   if (n is visited)
     return;
   mark n is visited;
   // generate clauses for the simple gate
   g = get_gate_of_node(n);
   cList = generate_cnf_gate(g);
   // add fanin information for CNF variable
   v = satVarId(n);
   foreach clause c in cList {
     add clauseId(c) to faninList(v);
   }
   // recursively handle gate's inputs
   foreach input w of gate g {
     generate_cnf_node(w);
   }
}
```

FIG. 3

Inputs : x,y,z
Output : o
Value Ranges :
x,y:{0,1,2,3}
z,o:{0,1}

Table:
x y z → o
default 0
1 2 1    1
=y- 0    1
2 3 -    =z

Each multi-valued variable is encoded by binary variables
x : x0 x1 (LSB)
y : y0 y1 (LSB)

CNF Generation for Given Table:
A new variable is introduced for each row of table (v1,v2,v3).
An equality constraint at the inputs also introduces new
variables - one per Boolean variable (v4,v5).

Clauses for introduced variables:
$v1=(x0' \wedge x1 \wedge y0 \wedge y1' \wedge z)$ (c1)
$v2=(v4 \wedge v5 \wedge z')$ (c2)
$v3=(x0 \wedge x1' \wedge y0 \wedge y1)$ (c3)
$v4=(x0=y0)$ (c4)
$v5=(x1=y1)$ (c5)
Clauses for output per row:
$v1 \rightarrow o$ (c6)
$v2 \rightarrow o$ (c7)
$v3 \rightarrow (o=z)$ (c8)
Negation of all row variables implies default value of output:
$(v1' \wedge v2' \wedge v3') \rightarrow o'$ (C9)

Clauses are created for (c1)-(c9) using standard methods,
without introducing any other variables.

Structural Information for Given Table

| CNF Variable | Fanin List of Clauses |
|---|---|
| v1 | (c1) |
| v2 | (c2) |
| v3 | (c3) |
| v4 | (c4) |
| v5 | (c5) |
| o | (c6), (c7), (c8), (c9) |

FIG. 4

```
mark_active_cnf()
{
   foreach output node variable v {
      // start the recursive marking procedure
      mark_cnf_var(v);
   }
   // at the end clauses that are not marked are
  inactive
} mark_cnf_var(v)
{
   // termination condition
   if (v is visited)
      return;
   mark v is visited;
   // loop over each clause in its fanin list
   foreach cId in faninList(v) {
      c = clause[cId];
      // mark the clause as active
      mark_active_clause(c);
      // handle each variable in the clause
      foreach variable u in clause c {
         if (satisfied(c)  kk notAssigned(u))
            // variable is unobservable
            continue;
         else
            // recursively mark from variable
            mark_cnf_var(u);
      }
   }
}
```

FIG. 5

| Circuit Name | #L | #V/#C | Image Steps | VIS (Standard) Time(s) | SAT-based Method (VIS: SAT+BDDs) | | | | |
|---|---|---|---|---|---|---|---|---|---|
| | | | | | No ICR Time(s) | With ICR | | | |
| | | | | | | Time(s) | Speedup Ratio | % Inactive Clauses | % Inactive and Unsat Clauses |
| s1269 | 37 | 456/1244 | 10(C) | 3269 | 2688 | 2164 | 1.24 | 60.9 | 14.9 |
| s1512 | 57 | 496/1301 | 1024(C) | 2647 | 5753 | 5768 | 1.00 | 18.7 | 0.9 |
| s3271 | 116 | 1183/3219 | 17(C) | 17933 | 14793 | 14036 | 1.05 | 48.7 | 28.6 |
| s3330 | 132 | 846/2114 | 9(C) | 20029 | 3967 | 2029 | 1.96 | 41.2 | 15.7 |
| prolog | 136 | 1027/2607 | 4<br>9(C) | 25003<br>TT | 765<br>11175 | 674<br>4697 | 2.38 | 36.8 | 12.8 |
| s5378 | 164 | 1012/2819 | 8<br>45(C) | 57986<br>SS < 30h | 5957<br>60500 | 6016<br>90337 | 0.67 | 28.3 | 5.3 |
| s1423 | 74 | 574/1464 | 11<br>12<br>13 | 8791<br>TT<br>TT | 3010<br>9577<br>TT | 3318<br>5423<br>13151 | 1.77 | 32.7 | 4.7 |
| s3384 | 183 | 1187/2853 | 4<br>5<br>6 | 24875<br>TT<br>TT | 787<br>2882<br>TT | 557<br>1095<br>7801 | 2.63 | 24.0 | 0 |
| s9234.1 | 211 | 2316/6548 | 7<br>9 | 2360<br>11577 | 8030<br>TT | 4569<br>22777 | 1.76 | 31.1 | 9.3 |
| s13207.1 | 638 | 3464/8773 | 8<br>10<br>14 | 2285<br>4906<br>28600 | 28025<br>TT<br>TT | 5061<br>8340<br>TT | 5.54 | 29.9 | 5.6 |

FIG. 6

| prolog circuit | | No ICR | | With ICR | | | |
|---|---|---|---|---|---|---|---|
| Step | Reached States | Time (s) | # BDD Leaves | Time (s) | # BDD Leaves | % Inactive Clauses | % Inactive and Unsat Clauses |
| 1 | 3.77487e+07 | 18.1 | 2 | 17.2 | 2 | 31.8 | 14.5 |
| 2 | 4.93249e+09 | 7.4 | 3 | 7.1 | 3 | 32.9 | 14.3 |
| 3 | 5.95738e+14 | 35.1 | 11 | 55.2 | 12 | 38.8 | 16.0 |
| 4 | 1.29149e+16 | 705.2 | 24 | 595.0 | 22 | 36.9 | 12.4 |
| 5 | 1.7276e+17 | 1872.9 | 24 | 2671.3 | 22 | 36.9 | 12.4 |
| 6 | 5.99378e+17 | 2814.7 | 26 | 645.8 | 22 | 36.9 | 12.4 |
| 7 | 7.22992e+17 | 2108.5 | 26 | 380.2 | 22 | 36.9 | 12.4 |
| 8 | 7.2778e+17 | 3485.1 | 40 | 293.6 | 22 | 36.9 | 12.4 |
| 9 | 7.2778e+17 | 128.1 | 23 | 32.0 | 22 | 36.9 | 12.4 |
| Total | 7.2778e+17 | 11175.0 | 179 | 4697.5 | 149 | 36.8 | 12.8 |
| | | Peak BDDs=8.7M Live BDDs=2.7M | | Peak BDDs=2.7M Live BDDs=0.9M | | | |

DYNAMIC DETECTION AND REMOVAL OF INACTIVE CLAUSES IN SAT WITH APPLICATION IN IMAGE COMPUTATION

RELATED APPLICATIONS

This Application claims priority from U.S. Provisional Application Ser. No. 60/243,440, filed Oct. 27, 2000.

FIELD

This disclosure teaches a technique for dynamically removing inactive clauses in a Boolean satisfiability checking (SAT) problem. While, specific example circuit types might be discussed to better understand the disclosed technique, the technique itself is applicable to any circuit analysis problem that uses SAT. The precise scope of the disclosed technique should be self-evident from the claims.

BACKGROUND

1. References

The following papers provide useful background information, for which they are incorporated herein by reference in their entirety, and are selectively referred to in the remainder of this disclosure by their accompanying reference numbers in square brackets (i.e., [2] for the second numbered paper by A. Biere et al.):

[1] M. Abramovici, M. A. Bruer, and A. D. Friedman. Digital Systems Testing and testable Design. Electrical Engineering, Communications and Signal Processing. Computer Science Press, New York, N.Y., 1990.

[2] A. Biere, A. Cimatti, E. M. Clarke, and Y. Zhu. Symbolic model checking without BDDs. In Tools and Algorithms for the Analysis and Construction of Systems (TACAS), volume 1579 of Lecture Notes in Computer Science, 1999.

[3] R. K. Brayton et al. VIS: A system for verification and synthesis. In R. Alur and T. Henzinger, editors, Proceedings of the Internation Conference on Computer-Aided Verification, volume 1102 of Lecture Notes in Computer Science, pages 428–432, June 1996.

[4] R. E. Bryant. Graph-based algorithms for Boolean function manipulation. IEEE Transactions on Computers, C-35(8):677–691, August 1986.

[5]. Burch and V. Singhal. Tight integration of combinational verification methods. In Proceedings of the International Conference on Computer-Aided Design, pages 570–576, 1998.

[6]. R. Burch, E. M. Clarke, D. E. Long, K. L. McMillan, and D. L. Dill. Symbolic model checking for sequential circuit verification. IEEE Transactions on Computer-Aided Design, 13(4):401–424, April 1994.

[7] S. T. Chakradhar, V. D. Agrawal, and S. G. Rothweiler. A transitive closure algorithm for test generation. IEEE Transactions on Computer-Aided Design of Integrated Circuits and Systems, 12(1): 1015–1028, July 1993.

[8] Coudert, J. C. Madre, and C. Berthet. Verifying temporal properties of sequential machines without building their state diagrams. In Proceedings of the International Conference on Computer-Aided Verification (CAV 90), volume 3 of DIMACS Series in Discrete Mathematics and Theoretical Computer Science, 1991.

[9] A. Gupta and P. Ashar. Integrating a Boolean satisfiability checker and BDDs for combinational verification. In Proceedings of the VLSI Design Conference, January 1998.

[10] A. Gupta, Z. Yang, A. Gupta, and P. Ashar. Sat-based image computation with application in reachability analysis. In Formal Methods in Computer-Aided Design, 2000.

[11] W. Kunz and D. Pradhan. Recursive learning: A new implication technique for efficient solutions to cad problems—test, verification and optimization. IEEE Transactions on Computer-Aided Design of Integrated Circuits and Systems, 13(9):1143–1158, September 1994.

[12] T. Larrabee. Test pattern generation using Boolean satisfiability. IEEE Transactions on Computer-Aided Design of Integrated Circuits and Systems, 11(l):4–15, January 1992.

[13] J. P. Marques-Silva and A. L. Oliveira. Improving satisfiability algorithms with dominance and partitioning. In IEEE/ACM International Workshop on Logic Synthesis, May 1997.

[14] J. P. Marques-Silva and K. A. Sakallah. Grasp: A new search algorithm for satisfiability. In Proceedings of the International Conference on Computer-Aided Design, pages 220–227, November 1996.

[15] J. P. Marquez-Silva. Grasp package. http://algos.inesc.pt/~jpms/software.html.

[16] I.-H. Moon, G. Hachtel, and F. Somenzi. Border-clock triangular form and conjunction schedule in image computation. In Proceedings of the Conference on Formal Methods in Computer-Aided Design, 2000.

[17] I.-H. Moon, J. Kukula, K. Ravi, and F Somenzi. To split or to conjoin: The question in image computation. In Proceedings of the Design Automation Conference, pages 23–28, June 2000.

[18] M. Moskewicz, C. Madigan, Y. Zhao, L. Zhang, and S. Malik. Engineering a (super?) efficient SAT solver. In Proceedings of the Design Automation Conference, 2001.

[19] M. Sheeran and G. Stalmark. A tutorial on Stalmark's method of propositional proof. Formal Methods in System Design, 16(1), 2000.

[20] O. Shtrichman. Tuning SAT checkers for bounded model checking. In proceedings of the International Conference on Computer-Aided Verification, 2000.

[21] F. Somenzi et al. CUDD: University of Colorado Decision Diagram Package. http://visi.colorado.edu/~fabio/CUDD/.

[22] H. Zhang. SATO: an efficient propositional prover. In International Conference on Automated Deduction, number 1249 in LNAI, pages 272–275, 1997.

2. Related Work

Checking Boolean Satisfiability (SAT) is required for a number of applications in VLSI CAD including combinational verification, Automatic Test Pattern Generation (ATPG), timing analysis, synthesis and, recently, reachability analysis and model checking. Acceleration of SAT can have significant impact in terms of improving the quality of these applications. SAT has received considerable attention in the recent past, focusing both on basic improvements in the SAT algorithms [7, 11, 14, 19], and on various applications like Automatic Test Pattern Generation (ATPG) [12], equivalence checking [5, 9], bounded model checking (BMC) [2]. Recently, combining SAT techniques with BDDs has been shown to be effective for image computation with application in state reachability analysis of sequential circuits [10].

Typical SAT solvers are based on a Davis-Putnam style branch-and-bound algorithm, and include considerable sophistication in heuristics for decision making, implication gathering, and backtracking [15, 18, 22]. However, missing from these efforts is exploitation of the fact that most SAT problems arising in VLSI CAD are derived from logic gate netlists. Logic gate netlists have some special properties related to how gates are connected together to realize circuit functionality. These include properties like the input-tooutput flow of information, limitation on the fanout and fanin of each gate, and the connectivity and signal value dependence dynamically changing the controllability and observability of a gate. Such properties have not been exploited in conventional SAT packages.

On the other hand, circuit structure has been effectively utilized in many SAT applications, e.g., ATPG [1], BMC [20]. However, this utilization has been mostly application-specific. For example, justification/propagation frontiers in ATPG, and unrolled transition relations in BMC, are used for more effective decision heuristics in the associated SAT procedures.

While the technique disclosed herein provide a clear benefit to SAT algorithms, it is also important to put the disclosed ideas in the context of the large body of work in conventional combinational ATPG [1]. Unlike traditional SAT, conventional ATPG algorithms operate on data structures at the level of the circuit structure itself. As a result, all circuit information, including gate connectivity, is directly available to these algorithms. In-deed, dynamic detection of inactive circuit regions is performed by the justification-propagation operations, which are at the core of ATPG algorithms. However, there is no explicit removal of these inactive regions. In particular, the overhead of propagating values through inactive regions is not avoided.

In terms of detecting redundant clauses in a SAT formula, a recent effort [13] proposed the use of clause dominance in the inner loop of the SAT algorithm. Unfortunately, the effort required for detection of dominating clauses is high, and it typically negates the gains arising out of clause removal.

However, circuit structures can be advantageously exploited in order to improve the performance of generic SAT applications arising in VLSI CAD. In particular, the notion of unobservability of gates at circuit outputs can be advantageously used to reduce the size of the SAT sub-problems. It is well known that, like all search algorithms, the effectiveness of a SAT algorithm is based on the amount of pruning of the search space it enables. The amount of pruning, in turn, is directly affected by the decision making heuristics and implication methods. Typically, their effectiveness is inversely proportional to the size of the SAT problem. Thus, the size of a SAT problem affects not only the size of the search space, but also the effectiveness of pruning methods. Therefore, it is generally advantageous to reduce the size of the SAT problem.

The disclosed techniques are aimed at realizing the advantages mentioned above.

3. Image Computation Using SAT

This sub-section describes image computation using SAT. The background information provided in this section will assist in understanding the Experimental Results described in Section IV.D. Historically, symbolic state space traversal [6, 8] has relied on efficient algorithms based on BDDs [4] for carrying out an image computation, shown below:

$$\text{Image }(P,T)(y) = \exists_{x,i} T(x, i, y) \cdot P(X) \qquad (1)$$

Here, x/y denote present/next state variables, i denotes primary input variables, T denotes the transition relation, and P denotes the input state set. BDDs are used to represent the characteristic function of the transition relation, as well as the input/image sets. As an example application, the set of reachable states can be computed by starting from a set P which denotes the set of initial states of a system, and using image computation iteratively, until a fixpoint is reached. The BDD-based approaches work well when it is possible to represent the sets of states and the transition relation (as a whole, or in a usefully partitioned form) using BDDs. Unfortunately, BDD size is very sensitive to the number of variables, variable ordering, and the nature of the logic expressions being represented.

Recently, an integration of SAT and BDDs has been proposed for image computation [10], which represents the transition relation as a CNF formula, and organizes the search for solutions as a top-level SAT search. BDD-based sub-problems are invoked on-the-fly, in order to obtain multiple solutions simultaneously. Section IV.D describes experimental results for reachability analysis according to the disclosed technique based on this image computation engine.

II. SUMMARY

To achieve the advantages mentioned above there is provided a method of Boolean satisfiability checking (SAT) for a circuit. The method comprises identifying inactive clauses in the conjunctive normal form (CNF) of the circuit and removing the inactive clauses from the CNF.

According to another aspect, there is provided a method of reducing a size of a Boolean satisfiability checking (SAT) problem. The method comprises tagging variables and clauses of a conjunctive normal form (CNF) of a circuit once during a generation of the CNF description, the tagging being done based on a connectivity information of the circuit. The tagged information is used to perform backward traversals on the CNF description to remove inactive clauses.

In a further refinement, the inactive clauses are detected by marking all clauses and variables in a worst case.

In a still further refinement the inactive clauses are based on dynamic values of the variables, whereby whether a clause is inactive can change dynamically with the assigned value of a variable.

In a still further refinement, the detection is performed in an inner loop of the SAT search.

In a further refinement the tagging for a selected variable is performed by associating a fan-in list of clauses corresponding to a gate for which the selected variable represents an output, and recursively handling inputs for the gate in a similar manner.

In a still further refinement, the detection of inactive clauses are performed by a sub-process comprising adding all variables of interest to an active variable set. A variable is selected from the active variable set. A recursive backward traversal is performed for the selected variable. Clauses in a fan-in list associated with the selected variable are then looped over. Clauses that are looped over are marked as active. If an active clause is unsatisfied, all variables appearing in that clause are added to the active variable set. If an active clause is satisfied, only those variables in the clause that have assigned values are added to the active variable set. The steps are repeated for all unselected variables in the active variable set. All the unmarked clauses at the end are designated as inactive.

According to yet another aspect there is provided a method of solving an image computation problem using Boolean satisfiability checking (SAT) and binary decision diagrams (BDD), wherein at least one of the SAT checking and the associated BDD sub-problems is reduced by a process comprising tagging variables and clauses of a conjunctive normal form (CNF) of a circuit once during a generation of the CNF description , the tagging being done based on a connectivity information of the circuit and using the tagged information to perform backward traversals on the CNF description to remove inactive clauses.

In a further refinement, the inactive clauses are detected by marking all clauses and variables in a worst case.

In a still further refinement the inactive clauses are based on dynamic values of the variables, whereby whether a clause is inactive can change dynamically with the assigned value of a variable.

In a still further refinement, the detection is performed in an inner loop of the SAT search.

In a further refinement the tagging for a selected variable is performed by associating a fan-in list of clauses corresponding to a gate for which the selected variable represents an output, and recursively handling inputs for the gate in a similar manner.

In a still further refinement, the detection of inactive clauses are performed by a sub-process comprising adding all variables of interest to an active variable set. A variable is selected from the active variable set. A recursive backward traversal is performed for the selected variable. Clauses in a fan-in list associated with the selected variable are then looped over. Clauses that are looped over are marked as active. If an active clause is unsatisfied, all variables appearing in that clause are added to the active variable set. If an active clause is satisfied, only those variables in the clause that have assigned values are added to the active variable set. The steps are repeated for all unselected variables in the active variable set. All the unmarked clauses at the end are designated as inactive.

III. BRIEF DESCRIPTION OF THE DRAWINGS

The above objectives and advantages of the present invention will become more apparent by describing in detail preferred embodiments thereof with reference to the attached drawings in which:

FIGS. 1(a)–(b) show a circuit example.

FIG. 2 shows a pseudo code for CNF Generation.

FIG. 3 shows an example for CNF generation.

FIG. 4 shows a pseudo code for CNF marking.

FIG. 5 shows a table depicting reachability results using the disclosed technique for benchmark circuits.

FIG. 6 show a table depicting details of results for a prolog circuit using the disclosed technique.

IV. DETAILED DESCRIPTION

Overview of Embodiments

Figure 1A:
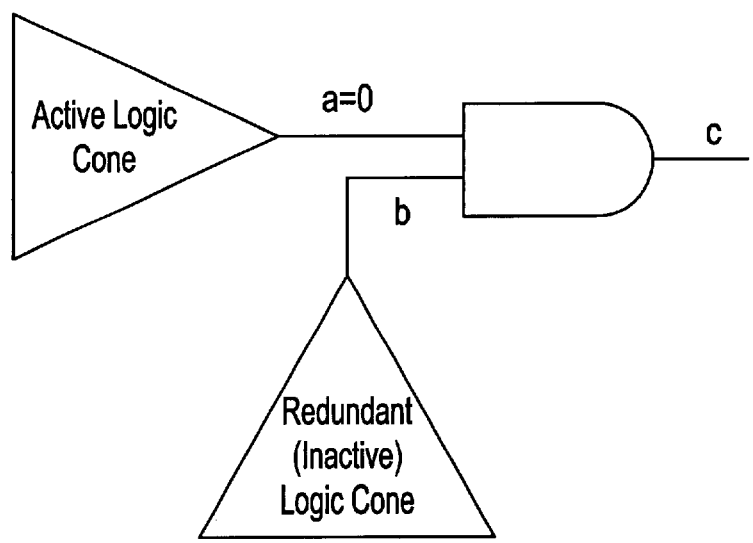

The disclosed optimization technique for reducing the size of SAT sub-problems uses the notion of unobservability for the dynamic detection and removal of inactive clauses. Inactive clauses are defined as clauses which do not affect the SAT solutions of interest. Rather than perform the analysis on the circuit structure, the disclosed optimization technique works directly on the CNF (Conjunctive Normal Form) description of the circuit. Since, typical SAT solvers use a CNF description of the problem, this avoids the overhead of multiple representations.

The variables and clauses of a CNF description are tagged with circuit connectivity information. The tagging is done only once, which is at the time of generating the CNF description from the circuit structure. Later, the tagging information is used repeatedly in the inner loop of a typical Davis-Putnam style branch-and-bound SAT algorithm to perform a backward traversal in order to remove inactive clauses. Background information on the conventional Davis-Putnam algorithm is described in [14]. Note that the connectivity information in the CNF description is adequate for any traversal of the corresponding circuit structure. Such a connectivity information can be potentially used in other optimizations, besides detection of inactive clauses.

The disclosed algorithms for generating the connectivity information, and using the connectivity information for detection of inactive clauses are both efficient. In particular, the algorithm for detecting inactive clauses involves marking all clauses and variables in the worst case. Depending upon the application, this cost can be either incurred at every decision level, or amortized over several decision levels within the SAT search. The important point to note is that the disclosed optimization technique provides a uniform way to exploit circuit connectivity information, and has the potential to accelerate all SAT applications in which the SAT formula is derived from a logic circuit representation.

In the present disclosure, a SAT-based image computation application for reachability analysis is focused. Further background information on the conventional SAT-based image computation application for reachability analysis is provided in [10]. For this application, the overhead of detecting inactive clauses at every decision level is negligible. Experimental results show that the use of this technique consistently improves the performance of a prototype tool, in some cases enabling it to reach more states than otherwise possible.

Comparison with Related Work

In contrast to conventional techniques, the disclosed technique effectively removes the inactive regions (clauses) from further consideration. Furthermore, it provides a way to exploit the gate connectivity information within a traditional SAT formulation based on CNF formulas. The disclosed techniques are also peripherally related to, but go beyond, the notion of dominators in ATPG. This is clarified further in Section IV.C.

Inactive Clauses

To understand the disclosed techniques better, consider the circuit shown in FIG. 1(a). Suppose, the signal a has been set to 0, say, within the branch-and-bound SAT search. This implies a 0 on signal c at the output of the AND gate. As a result, signal b becomes unobservable at the output. In addition, any gate which fans out only to the transitive fanin cone of signal b, i.e., is dominated by b, also becomes unobservable at the output. As a result, all clauses associated with such gates are inactive, in that they can be safely removed without affecting the SAT solution for the output. Note that the status of these clauses, i.e., whether or not they are inactive, depends on the values taken by variables a and b. In other words, it is determined dynamically within the SAT search which assigns/implies values for these variables.

Figure 1B:
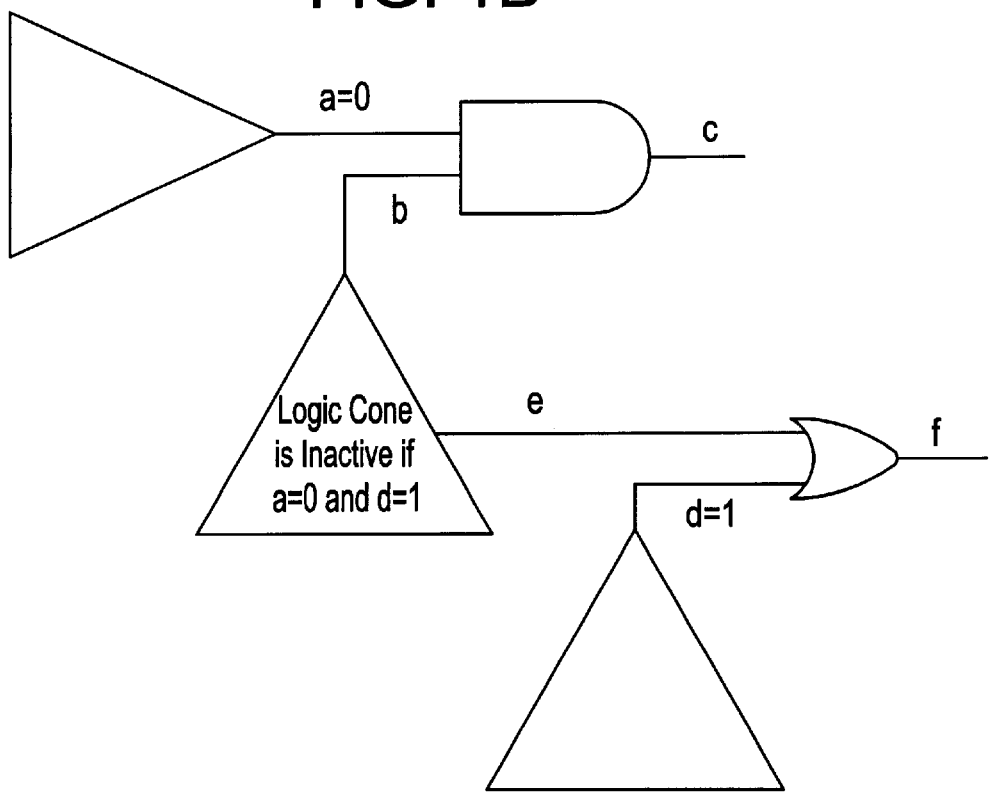

Now, consider a similar example shown in FIG. 1(b). Again, let signal a be set to 0, implying a 0 on signal c, and making signal b unobservable. Note that signal b does not statically dominate all gates in its fanin cone, since the shown signal e fans out to another gate. Consider the case where signal e is also unobservable, due to signal d being 1, thereby implying a 1 on the output signal f of that OR gate. In this case again, the clauses associated with all gates in cone of b are inactive, since these gates fan out to unobservable signals only.

The disclosed techniques may be considered to be peripherally related to dominators in combinational ATPG [1]. A gate G is called a structural dominator of a gate H if all paths from H to an output must pass through G. If gate G is a dominator of all gates and primary inputs in its transitive fanin, the justification process [1] in ATPG can stop at G. It must be separately checked that both 0/1 values can be generated at G for some input combinations.

However, the disclosed techniques go beyond the way dominators are used in ATPG. First, conventionally, the notion of structural dominators in testing is purely static. On the other hand, the notion of inactive clauses used in the disclosed techniques is a function of dynamic values on variables, i.e., whether or not a clause is inactive changes dynamically during the SAT search. Secondly, in the disclosed techniques inactive clauses can be completely removed from the sub-problem at that point in the SAT search. In contrast, ATPG algorithms use the dominators only to partition the overall problem into one for the dominated portion of the circuit, and another for the rest.

Given a gate-level circuit description, a simple backward traversal starting from circuit outputs can be performed in order to identify unobservable gates, and all clauses associated with such gates are guaranteed to be inactive. However, this requires switching back and forth between a circuit structure description and a CNF description. Since a goal for the disclosed teaching is to use inactive clause detection in the inner loop of a SAT search, it is desirable to reduce this overhead of switching back and forth. Partly to achieve this goal, the disclosed technique performs the analysis on the CNF description itself. A feature that enables this, is the association of the connectivity information between signals and gates of the circuit structure description, with the variables and clauses of the CNF description. This connectivity information is generated statically at the time of generating the CNF formula from the circuit structure. This connectivity information is then used dynamically within the SAT search to detect and remove inactive clauses. The next two subsections describe the techniques for generating structural information and removing inactive clauses, in detail.

1. Structural Information for CNF

Typically, the signals of a circuit are represented as variables, and the functionality of each gate is expressed as clauses for generation of a CNF formula from a circuit structure. Background information on such a representation can be found in [12]. To capture the circuit structural connectivity for a backward traversal, the set of clauses for each gate are associated as the fan-in list for the variable which denotes the output of that gate. Thus, each variable (except a primary input variable) is associated with a fan-in list of clauses. Note also that the other clauses which a variable might appear in, e.g., clauses for gates in its fanout, are not required for backward traversal. (For a forward traversal, we could similarly associate a fan-out list of clauses with each variable.)

The pseudo-code of an example implementation of the algorithm for generating these fan-in lists along with CNF generation is shown in FIG. 2. Here, we assume the availability of a gate-level circuit description in terms of simple Boolean gates.

The complex combinational gates can be handled easily as well. A typical format for such gates is that of a table, where each row of the table identifies a tuple of allowable inputs and output(s), such as that used in VIS [3]. An example of CNF generation and structural information for such a table is shown in FIG. 3. It also demonstrates how multi-valued variables such as x, y, and equality constraints such as (=y), (=z) are handled. Since complex gates usually result in introduction of many extra CNF variables, a post-processing phase of compacting the CNF description is used.

2. Detecting Inactive Clauses

The pseudo-code for our procedure for detecting inactive clauses is shown in FIG. 4. A recursive backward traversal is performed over all variables, starting from each variable denoting a circuit output. For each variable, the clauses in its fanin list are looped over, each of which is marked "active". If the clause is unsatisfied, then a recursive traversal is invoked for each of the variables appearing in the clause. This is because each of these variables, whether assigned or unassigned, is "observable" in the sense that it can affect the satisfiability status of the clause. On the other hand, if the clause is satisfied, then only its assigned variables are "observable". Indeed, each unassigned variable of a satisfied clause is "unobservable" in the sense that it cannot affect its satisfiability status. Therefore, the backward traversal is not invoked for such variables. The marking procedure used herein is safe, i.e., any clause which is unmarked at the end is guaranteed to be inactive. (The simple connectivity information that is used is not enough to make an exact determination of all unobservable gates. For simple gates, the additional information required is identification of controlling input values, but this is hard to generalize for complex combinational gates described earlier.)

In terms of complexity, note that the traversal involves marking all clauses and variables in the worst case. Depending on the application, this cost can be either incurred at every decision level, or amortized over multiple decision levels within the SAT search. All clauses which are marked inactive need not be considered for satisfaction or for decision heuristics in the sub-tree rooted at that decision level. Note that these clauses may again become active after back-tracking from this decision level.

Experimental Results

There has been significant progress made in symbolic reachability analysis in recent years. The SAT-based image computation with and without the inactive clause removal (ICR) optimization according to the disclosed techniques is compared to state of the art techniques in VIS [3], a public domain tool. The disclosed prototype implementation of the SAT-based image computation algorithm uses the GRASP SAT solver [15] and the CUDD BDD package [21], and has been integrated within VIS. All reported experiments were run on an UltraSparc machine, with a 296 Mhz processor, and 1 GB memory. Dynamic variable reordering was enabled throughout. Unless noted otherwise, a time limit of 10 hours was used, and a "TT" in the results tables indicates a timeout, while an "SS" indicates a spaceout.

1. Reachability Analysis

Results for reachability analysis according the disclosed techniques on the benchmark circuits are shown in Table 1 in FIG. 4. The name of the circuit appears in Column 1, and number of latches in Column 2 (marked #L). The number of CNF variables and clauses are shown, respectively in Column 3 (marked #V/#C). Column 4 shows the number of image steps completed, and a "(C)" after the number of steps indicates that the traversal was complete, i.e., a fixpoint was reached. Column 5 shows the CPU time (in seconds) for standard VIS [3], which uses only BDDs for image computation. The remaining columns report the results for the SAT-based image computation method, which is labeled (VIS: SAT+BDDs) in the table. Columns 6 and 7 report the CPU time (in seconds) without and with ICR, respectively. Column 8 reports the speedup factor as a ratio of (time without ICR)/(time with ICR). Finally, columns 9 and 10 report the percentage of clauses that were found inactive, and the percentage of clauses that were found inactive and unsatisfied. While the former number indicates the occurrence of inactive clauses, the latter number is a more useful figure of merit, since unsatisfied clauses critically affect SAT search in the sub-tree rooted at a decision level.

2. Discussion

Broadly speaking, the SAT-based image computation technique according to the disclosed teachings does well in majority of the circuits when compared with standard VIS. It should he noted that the disclosed technique, i.e., the use of ICR, improves this method even further. In particular, the method with ICR performs better in 9 of the 10 benchmarks circuits compared to SAT-based method without this optimization (Column 8). This clearly demonstrates that detecting inactive clauses and their removal is beneficial to the underlying search. Not surprisingly, the benefit seems to be greater when more inactive clauses are found, as indicated by a higher number in Column 9. Though not shown in the table, the overhead of applying ICR is minimal, constituting less than 10 seconds of CPU time in the largest experiment.

In terms of details, the SAT-based methods performs fairly well for the first 4 "easy" circuits where all methods complete traversal. In particular, for s3330, the method with ICR outperforms standard VIS by an order of magnitude. The real benefit of SAT-based image computation is demonstrated by the next two circuits—prolog, and s5378. The SAT-based method is successful in performing a complete traversal, both with and without ICR, whereas VIS is not. For these circuits, and the next two circuits—s1423, and s3384—the SAT method is consistently faster, sometimes by two orders of magnitude, and completes more steps through use of ICR. Finally, the last two circuits—s9234, and s13207—have a bigger CNF representation than the other circuits, making the SAT-based method less effective. For these two circuits, the use of ICR improves the SAT-based method by greater than factors of 2, and 5, respectively. This has the benefit of closing the performance gap between the SAT-based method and standard VIS.

In the SAT-based image computation application, ICR affects both the decision making in SAT, as well as size of the BDD sub-problems which is directly related to the number of unsatisfied clauses. The result in Column 10 for circuit s3384 is very interesting for this reason. Since there are no inactive unsatisfied clauses, the size of the BDD sub-problems does not change. However, it is due to the different decision making in SAT (leading perhaps to different BDD sub-problems) that we get a speedup factor of 2.63. To demonstrate this effect of ICR, we present details of the experimental results for the prolog circuit in Table 2 shown in FIG. 5, where labels of the Columns are similar to Table 1. Note that use of ICR results in less number of BDD leaves (sub-problems) in most image computation steps of the complete traversal. Also, the fraction of inactive clauses and inactive unsatisfied clauses remains consistently high in all steps. More tellingly, the overall peak BDD nodes and the maximum live BDD nodes (as reported by the CUDD package) are considerably lower with the use of ICR.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of Boolean satisfiability checking (SAT) for a circuit, the method comprising:

(a) identifying inactive clauses in the conjunctive normal form (CNF) of the circuit; and
(b) removing the inactive clauses from the CNF.

2. A method of reducing a size of a Boolean satisfiability checking (SAT) problem, said method comprising:

(a) tagging variables and clauses of a conjunctive normal form (CNF) of a circuit once during a generation of the CNF description, the tagging being done based on a connectivity information of the circuit; and
(b) using the tagged information to perform backward traversals on the CNF description to remove inactive clauses.

3. The method of claim 2, wherein the inactive clauses are detected by marking all clauses and variables in a worst case.

4. The method of claim 3, wherein said inactive clauses are based on dynamic values of the variables, whereby whether a clause is inactive can change dynamically with the assigned value of a variable.

5. The method of claim 3, wherein the detection is performed in an inner loop of the SAT search.

6. The method of claim 2, wherein said tagging for a selected variable is performed by associating a fan in list of clauses corresponding to a gate for which the selected variable represents an output, and recursively handling inputs for the gate.

7. The method of claim 4, wherein said detection of inactive clauses are performed by a sub-process comprising:

(b)(1) adding all variables of interest to an active variable set;
(b) (2) selecting a variable from the active variable set;
(b) (3) starting a recursive backward traversal for the selected variable;
(b)(4) looping over clauses in a fan in list associated with the selected variable;
(b)(5) marking clauses that are looped over in step (b)(4) as active;
(b)(6) if an active clause is unsatisfied, adding all variables appearing in that clause to the active variable set;
(b)(7) if an active clause is satisfied, adding only those variables in the clause that have assigned values to the active variable set;
(b)(8) repeating steps (b)(2)–(b)(7) for all hitherto unselected variables in the active variable set; and
(b)(9) designating all the unmarked clauses as inactive.

8. A method of solving an image computation problem using Boolean satisfiability checking (SAT) and binary decision diagrams (BDD), wherein at least one of the SAT checking and the associated BDD sub-problems is reduced by a process comprising:

(a) tagging variables and clauses of a conjunctive normal form (CNF) of a circuit once during a generation of the CNF description, the tagging being done based on a connectivity information of the circuit; and
(b) using the tagged information to perform backward traversals on the CNF description to remove inactive clauses.

9. The method of claim 8, wherein the inactive clauses are detected by marking all clauses and variables in a worst case.

10. The method of claim 9, wherein said inactive clauses are based on dynamic values of the variables, whereby whether a clause is inactive can change dynamically with the assigned value of a variable.

11. The method of claim 9, wherein the detection is performed in an inner loop of the SAT search.

12. The method of claim 8, wherein said tagging for a selected variable is performed by associating a fan in list of clauses corresponding to a gate for which the selected variable represents an output, and recursively handling inputs for the gate.

13. The method of claim 10, wherein said detection of inactive clauses are performed by a sub-process comprising:
- (b)(1) adding all variables of interest to an active variable set;
- (b) (2) selecting a variable from the active variable set;
- (b) (3) starting a recursive backward traversal for the selected variable;
- (b)(4) looping over clauses in a fan in list associated with the selected variable;
- (b)(5) marking clauses that are looped over in step (b)(4) as active;
- (b)(6) if an active clause is unsatisfied, adding all variables appearing in that clause to the active variable set; and
- (b)(7) if an active clause is satisfied, adding to the active variable set only those variables in that clause that have assigned values
- (b)(8) repeating steps (b)(2)–(b)(7) for all hitherto unselected variables in the active variable set; and
- (b)(9) designating all the unmarked clauses as inactive.

* * * * *